United States Patent
Obara

(10) Patent No.: US 9,857,722 B2
(45) Date of Patent: Jan. 2, 2018

(54) LIGHT SOURCE DEVICE, OPTICAL SCANNING APPARATUS, AND IMAGE FORMING APPARATUS

(71) Applicant: CANON KABUSHIKI KAISHA, Tokyo (JP)

(72) Inventor: Mitsuhiro Obara, Suntou-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/262,962

(22) Filed: Sep. 12, 2016

(65) Prior Publication Data

US 2017/0090340 A1    Mar. 30, 2017

(30) Foreign Application Priority Data

Sep. 24, 2015   (JP) ................................ 2015-187133

(51) Int. Cl.
  *G03G 15/04*   (2006.01)
  *H01S 5/022*   (2006.01)

(52) U.S. Cl.
  CPC .  *G03G 15/04036* (2013.01); *G03G 15/04072* (2013.01); *H01S 5/02208* (2013.01)

(58) Field of Classification Search
  CPC ............... G03G 15/326; G03G 15/043; G03G 15/04036; B41J 2/473; G02B 26/121; G02B 26/123; G02B 26/08; G02B 26/10; G02B 26/124; G02B 26/129; G02B 26/1252
  See application file for complete search history.

(56) References Cited

U.S. PATENT DOCUMENTS

| | | | |
|---|---|---|---|
| 5,003,614 A | 3/1991 | Tanaka et al. | 382/18 |
| 6,856,338 B2 | 2/2005 | Takahashi et al. | 347/225 |
| 6,928,100 B2 | 8/2005 | Sato et al. | G02B 7/025 |
| 6,969,846 B2 | 11/2005 | Tanaka et al. | 250/239 |
| 7,508,859 B2 | 3/2009 | Azami et al. | 372/101 |
| 8,355,192 B2 | 1/2013 | Obara | 359/204.1 |
| 8,681,405 B2 | 3/2014 | Obara | 359/204.1 |

(Continued)

FOREIGN PATENT DOCUMENTS

| | | |
|---|---|---|
| JP | H7-159663 | 6/1995 |
| JP | 2002-244062 | 8/2002 |

(Continued)

OTHER PUBLICATIONS

U.S. Appl. No. 15/261,484, filed Sep. 9, 2016.
Extended European Search Report dated Jan. 25, 2017 in counterpart European Application No. 16187536.4.

*Primary Examiner* — Clayton E LaBalle
*Assistant Examiner* — Ruifeng Pu
(74) *Attorney, Agent, or Firm* — Fitzpatrick, Cella, Harper & Scinto

(57) ABSTRACT

A light source device includes a semiconductor laser configured to emit a laser beam, the semiconductor laser including a stem provided with a cut-away portion; and a holder member including a cylindrical portion configured to hold the semiconductor laser, wherein an inner surface of the cylindrical portion has a surface opposing the stem, and wherein the opposing surface includes a contact portion disposed at a position corresponding to the cut-away portion and contacting the stem and a spaced portion spaced from the stem.

10 Claims, 10 Drawing Sheets

(56) References Cited

U.S. PATENT DOCUMENTS

| | | | |
|---|---|---|---|
| 8,717,656 B2* | 5/2014 | Shimizu | B41J 2/471 359/204.1 |
| 8,786,927 B2 | 7/2014 | Obara | G02B 26/123 |
| 8,911,112 B2 | 12/2014 | Takamatsu et al. | G02B 26/124 |
| 9,128,291 B2 | 9/2015 | Nagatoshi et al. | G02B 26/121 |
| 2007/0147461 A1 | 6/2007 | Shyu et al. | 372/107 |
| 2008/0049807 A1 | 2/2008 | Fujino | 372/50.23 |
| 2012/0218614 A1* | 8/2012 | Kusuda | H05K 3/301 359/204.1 |
| 2015/0338768 A1 | 11/2015 | Nagatoshi et al. | G03G 15/043 |
| 2016/0131896 A1 | 5/2016 | Nakamura et al. | G02B 26/121 |
| 2017/0075251 A1* | 3/2017 | Yamaya | G03G 15/04036 |

FOREIGN PATENT DOCUMENTS

| | | |
|---|---|---|
| JP | 2003-098413 | 4/2003 |
| JP | 2003-98464 | 4/2003 |
| JP | 2004-163607 | 6/2004 |
| JP | 2007-286386 | 11/2007 |
| JP | 2010-72185 | 4/2010 |
| JP | 2012-155100 | 8/2012 |

* cited by examiner (a)

(b)

(a)

(b)

LIGHT SOURCE DEVICE, OPTICAL SCANNING APPARATUS, AND IMAGE FORMING APPARATUS

FIELD OF THE INVENTION AND RELATED ART

The present invention relates to a light source apparatus which emits a beam of laser light. It relates also to an optical scanning apparatus equipped with a light source apparatus, and an image forming apparatus equipped with the optical scanning apparatus.

Part (a) of FIG. 8 is a perspective view of a light source which emits a beam of laser light, and part (b) of FIG. 8 is a sectional view of the light source apparatus. A beam of laser light emitted from a laser S is converted into a parallel beam by a collimator lens C. The laser S internally holds an unshown laser light emitting element. It is held to a holder F by a stem P, which is a flange portion pressed into a cylindrical portion H of the holder F. The collimator lens is adjusted in position in terms of its radius direction in order to adjust its optical axis in position. Next, the collimator lens is adjusted in position in terms of the direction parallel to its optical axis. Then, it is fixed to the holder with the use of adhesive. Further, collimator lens is placed in contact with a holder by being moved in the direction parallel to its optical axis. Then, it is fixed to the holder with the use of photo-curable adhesive.

There have been proposed various methods for fixing a laser to a light source apparatus such as the above-described one. For example, Japanese Laid-open Patent Application No. 2003-244062 discloses one of such methods. According to this patent application, a laser is held to the holder by being pressed into the holder in such a manner that the peripheral surface of its stem portion remains in contact with the holder. Further, in the case of the light source apparatus disclosed in Japanese Laid-open Patent, the cylindrical portion H of the holder F is provided with a laser seating surface T which opposes the stem portion P in terms of the direction parallel to the optical axis of the beam of laser light, as shown in FIG. 9. Thus, as the laser S is pressed into the cylindrical portion H of the holder F, the stem portion P of the laser S comes into contact with the laser seating surface T of the holder F. Consequently, the laser S is fixed in position relative to the holder F in terms of the direction parallel to the optical axis of the beam of laser light.

The stem portion of a laser is likely to be provided with recesses, because of such a reason that it has to be manipulated during laser manufacturing, or the like reason (FIG. 4). In a case of the laser, disclosed in Japanese Laid-open Patent Application No. 2002-244062, which uses a stem portion having recesses, the recesses leave gaps between the holder and the laser.

Further, with regard to a collimator lens, a gap is provided as an adjustment clearance, between the collimator lens and holder, in order to adjust the collimator lens in position as described above. In other words, a light source apparatus has two types of opening, that is, the opening left by the recess of the stem portion of the laser, between the stem portion of the laser and the holder, and the opening between the holder and collimator lens. These openings can function as an air entrance or an air exit, making it likely for an air flow to be created in the light source apparatus.

If an air flow exists in a light source apparatus, it is possible that foreign substances will enter the apparatus from outside the apparatus, and adhere to the portion of the apparatus, though which a beam of laser light is projected outward from the apparatus. If the foreign substances adhere to the portion of the light source apparatus, through which a beam of laser light is projected outward from the apparatus, it is possible that the beam is partially, or even completely, blocked, making it possible that the beam emitted from the light source apparatus will be insufficient in intensity, and therefore, image defects will occur. In particular, a beam of laser light emitted from a laser is highly focused. Therefore, even if the foreign substances having adhered to the portion of the light source apparatus are very small, their ill effects are substantial.

As for the types of foreign substance which will possibly enter a light source apparatus from outside the apparatus, they are likely to be dust particles in the ambient air. Moreover, various types of laser beam printer are structured to draw the ambient air into themselves with the use of a fan in order to cool their internal components, making it possible for the dust particles to be floating in the adjacencies of their optical scanning apparatus. Therefore, if there is an air flow in a light source apparatus, the dust particles carried by the air flow are likely to adhere to the laser.

In recent years, in order to reduce a laser in cost, development of a glass-less laser, that is, a laser which does not have a sealing glass, has been going on. In a case of a glass-less laser, the laser light emitting element (which will have been shielded from ambient air in conventional laser) is exposed to the ambient air. The portion of a laser light emitting element, from which laser light is emitted, is extremely small, being roughly several micrometers in size. Therefore, a glass-less laser is greater than a laser having a sealing glass, in terms of a risk that image defects will occur due to the foreign substance adhesion.

In the case of a light source apparatus structured like the one disclosed in Japanese Laid-open Patent Application No. 2003-98464, the stem portion P of the laser S is placed in contact with the laser seating surface T of the holder F. Therefore, even if the stem portion P is provided with recesses, no gap is left between the step portion P and the holder F after the pressing of the laser S into the holder F. However, in the case of the light source apparatus structured as disclosed in Japanese Laid-open Patent Application No. 2003-98464, it is possible that the shavings resulting from the pressing of the laser S into the cylindrical portion H of the holder F will prevent the laser S from being precisely positioned relative to the holder F as it is pressed into the cylindrical portion H, as will be described next. Therefore, there is a possibility that it will take longer to adjust the collimator lens C, and therefore, the light source apparatus will be increased in cost.

In order to ensure that as the laser S is pressed into the cylindrical portion H of the holder F, the laser S remains fixed to the holder F, the internal diameter of the cylindrical portion H of the holder F is made smaller than the external diameter of the stem portion P of the laser S. Further, the laser S is pressed into the cylindrical portion H from the opposite side of the cylindrical portion H from the side from which a beam of laser light is emitted. Therefore, as the laser S is pressed into the cylindrical portion H, the holder F is shaved by the stem portion P of the laser S. Thus, the shavings collect on the side from which a beam of laser light is emitted from the laser S, making it possible that the shavings will be sandwiched between the stem portion P and the laser seating surface T of the holder F. If the shavings are sandwiched between the stem portion P and surface T, the distance by which the laser S is pressed into the cylindrical portion H is reduced by an amount proportional to the amount of the shavings. Consequently, the laser S fails to be precisely positioned relative to the holder F.

As described above, in the case of a light source apparatus such as the above-described one, the collimator lens C is moved to adjust the light source apparatus in the positional relationship between its laser S and collimator lens C, in order to adjust the apparatus in laser beam focus. More concretely, as the collimator lens C is moved in the direction parallel to the optical axis of the beam of laser light, the beam of laser light is changed in width, as shown in FIG. 10. Therefore, the collimator lens C is moved with preset pitch to find a position at which the beam of laser light becomes narrowest in width. Then, the collimator lens C is fixed in this position in which the beam of laser light becomes narrowest. That is, in order to find the position which makes the beam of laser light narrowest, the collimator lens C is moved within a preset range.

Regarding the operation to move the collimator lens C with a preset pitch to adjust the collimator lens C in focus, the narrower the adjustment range, the shorter the length of time it takes to assemble a light source apparatus. Therefore, the adjustment range is set to the minimum value necessary for adjustment. However, the depth by which the laser S can be pressed into the cylindrical portion H of the holder F is affected by the amount of shavings resulting from the pressing of the laser S into the cylindrical portion H. Further, the amount by which the shavings are generated is affected by the properties of the holder F and those of the stem portion P of the laser S. Thus, in consideration of the difference in the amount of shavings among light source apparatuses, the adjustment range has to be increased. Increasing a light source apparatus in the adjustment range increases the apparatus in the length of time it takes to adjust the apparatus, which results in increase in apparatus cost.

SUMMARY OF THE INVENTION

The present invention was made in consideration of the present state of the development of a glass-less laser. Therefore, the primary object of the present invention is to provide a light source apparatus which is capable of reducing an image forming apparatus in the amount of image defects attributable to the adhesion of foreign substances to a laser, without being increased in the range in which its collimator lens can be adjusted in focus.

According to an aspect of the present invention, there is provided a light source device comprising a semiconductor laser configured to emit a laser beam, said semiconductor laser including a stem provided with a cut-away portion; and a holder member including a cylindrical portion configured to hold said semiconductor laser, wherein an inner surface of said cylindrical portion has a surface opposing said stem, and wherein said opposing surface includes a contact portion disposed at a position corresponding to said cut-away portion and contacting said stem and a spaced portion spaced from said stem.

Further features of the present invention will become apparent from the following description of exemplary embodiments with reference to the attached drawings.

DESCRIPTION OF THE EMBODIMENTS

Embodiment 1

Image Forming Apparatus

To begin with, the image forming apparatus A in the first embodiment of the present invention is described about its overall structure, along with its image forming operation, with reference to appended drawings.

Figure 1:
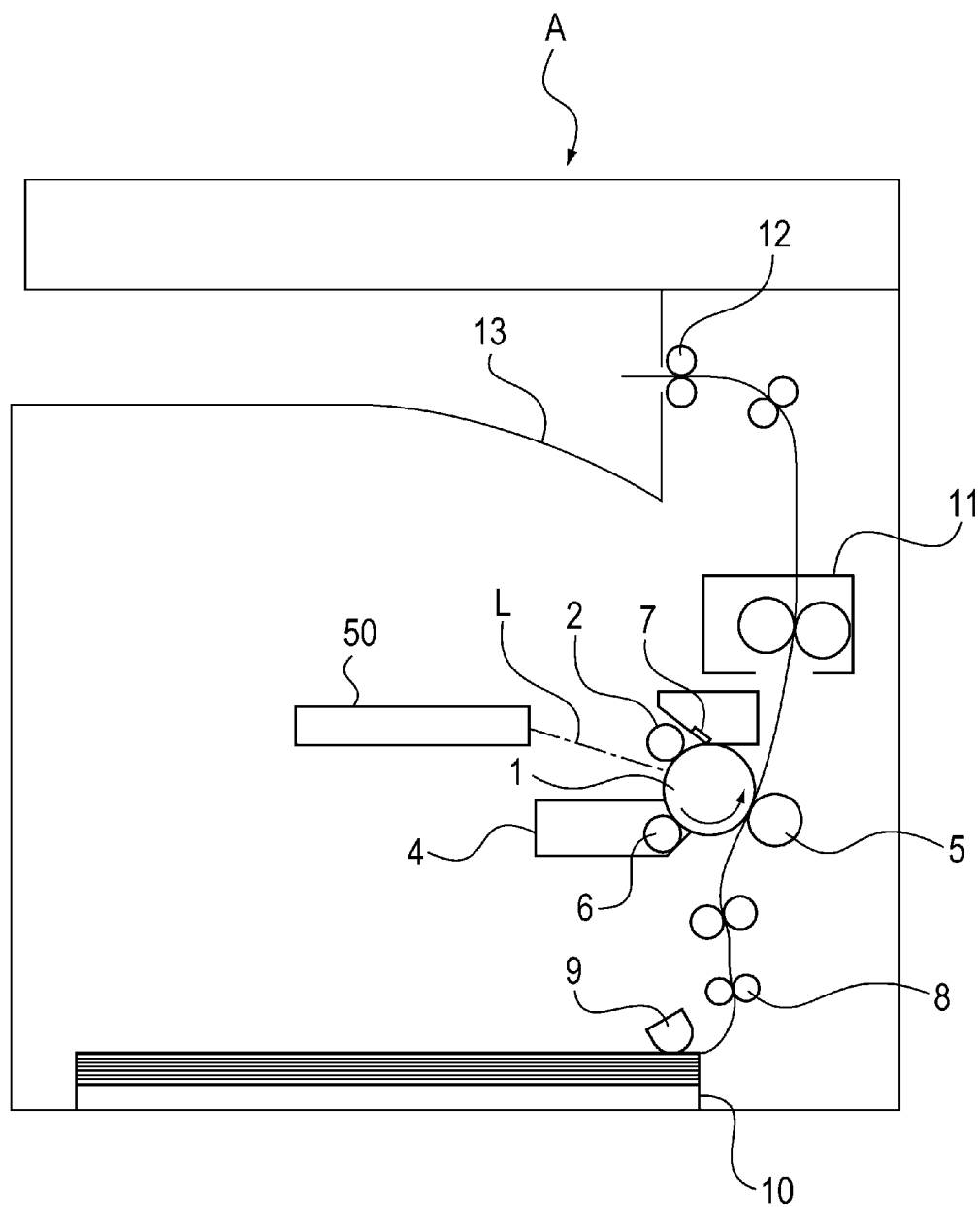
FIG. 1 is a schematic sectional view of an image forming apparatus.

Referring to FIG. 1, the image forming apparatus A has: an image forming portion which transfers a toner image onto a sheet of recording medium; a sheet conveying portion which supplies the image forming portion with a sheet of recording medium; and a fixing portion which fixes the toner image to the sheet.

The image forming portion has a photosensitive drum 1 (image bearing member), a charge roller 2, an optical scanning apparatus 50, a developing device 4, a transfer roller 5, etc.

In an image forming operation, as an unshown controlling portion of the image forming apparatus A outputs a print signal, one of the sheets of recording medium stored in layers in a sheet storing portion 10 is sent to the image forming portion by a combination of a sheet feeder roller 9 and a sheet conveyance roller 8.

Meanwhile in the image forming portion, charge bias is applied to the charge roller 2, whereby the peripheral surface of the photosensitive drum 1, which is in contact with the charge roller 2, is charged. Next, a beam of laser light is projected from a semiconductor laser 113, which a light source apparatus 100, shown in FIG. 3, internally holds, while being modulated according to the image information obtained by the optical scanning apparatus 50 (scanning means) from an unshown image reading portion, or the like, in a manner to scan (expose) the peripheral surface of the photosensitive drum 1. Thus, exposed points of the peripheral surface of the photosensitive drum 1 reduce in potential. Consequently, an electrostatic image which reflects the image information, is effected on the peripheral surface of the photosensitive drum 1.

Then, development bias is applied to the development sleeve 6, with which the developing device 4 is provided. Thus, toner (developer) is adhered to the electrostatic latent image formed on the peripheral surface of the photosensitive drum 1. As a result, a toner image is formed on the peripheral surface of the photosensitive drum 1. Then, the toner image is sent into a transfer nip, which is the area of contact between the photosensitive drum 1 and transfer roller 5. As the toner image arrives at the transfer nip, transfer bias, which is opposite in polarity from the toner, is applied to the transfer roller 5. Consequently, the toner image is transferred onto a sheet of recording medium.

After the transfer of the toner image onto a sheet of recording medium, the sheet is sent to the fixing device 11, and is conveyed through the fixation nip, which is the area of contact between the heating portion and pressure applying portions of the fixing device 11. While the sheet is conveyed through the fixation nip, the sheet and the toner image thereon are heated and pressed. Consequently, the toner image is fixed to the sheet. Then, the sheet is conveyed further, and is discharged into a delivery tray 13 by a pair of discharge rollers 12.

<Optical Scanning Device>

Figure 2:
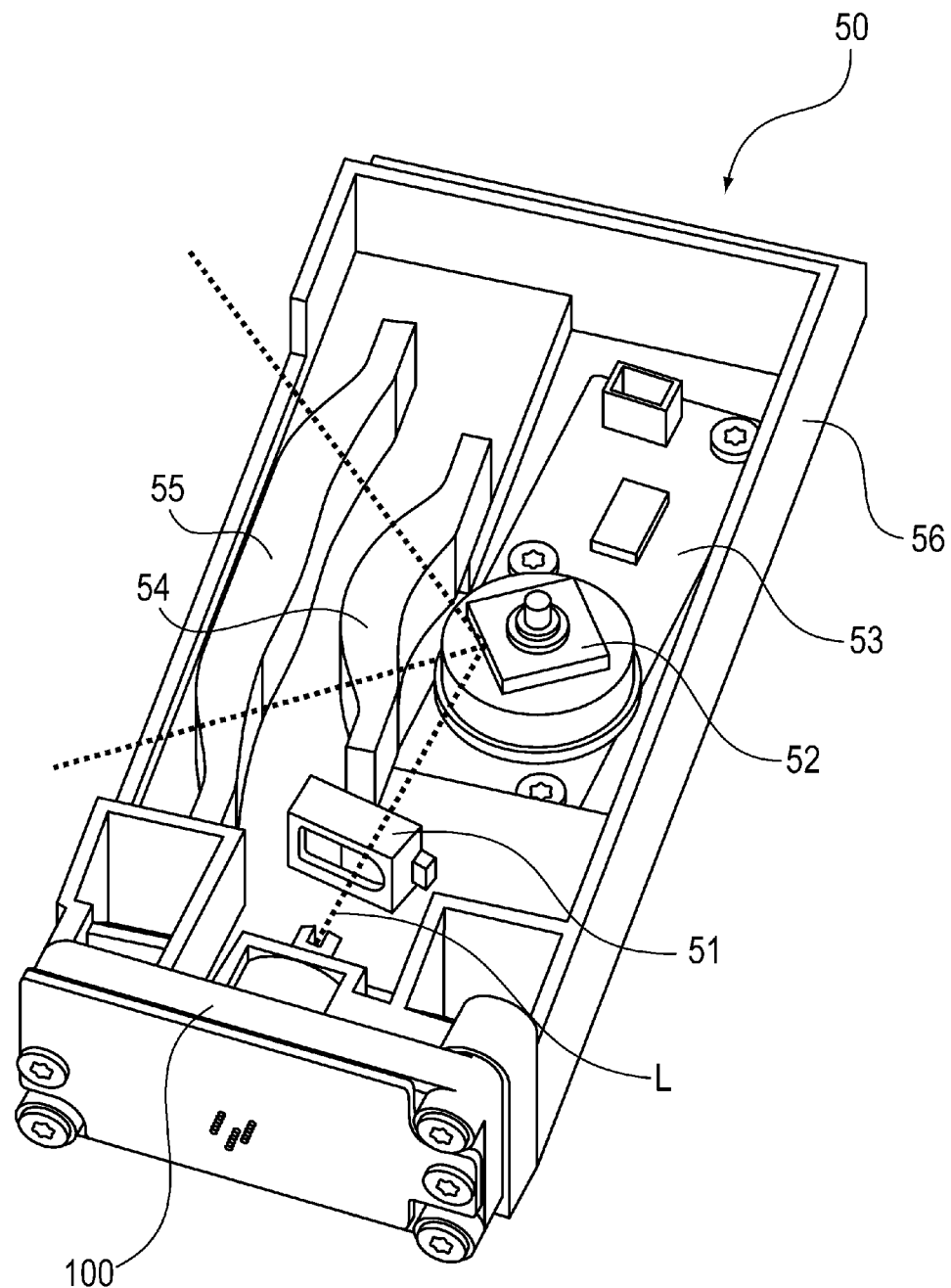
FIG. 2 is a perspective view of a light source apparatus.

Next, the optical scanning apparatus 50 is described about its structure. Referring to FIG. 2, the optical scanning apparatus 50 has: a light source apparatus 100, a cylindrical lens 51, a rotational polygonal mirror 52, a motor driving circuit board 53, a pair of f-θ lenses 54 and 55, and a casing 56, in which the preceding members are disposed.

As a beam L of laser light is emitted from the semiconductor laser 113 in the optical scanning apparatus 100, it is condensed by the cylindrical lens 51 in terms of only the secondary scan direction, and then, is condensed in a manner to form a long line across the reflective surfaces of the rotational polygonal mirror 52.

The rotation of the rotational polygonal mirror 52 is controlled by the motor driving circuit board 53, so that as the beam L of laser light hits the rotational polygonal mirror 52, it is deflected by the mirror 52 in a manner to scan the peripheral surface of the photosensitive drum 1. There, the deflected beam L of laser light travels through the f-θ lenses 54 and 55, and scans the peripheral surface of the photosensitive drum 1, while remaining focused on the peripheral surface of the photosensitive drum 1.

By the way, the top opening of the casing 56 is covered by an unshown resinous or metallic lid.

<Light Source Apparatus>

Figure 3:
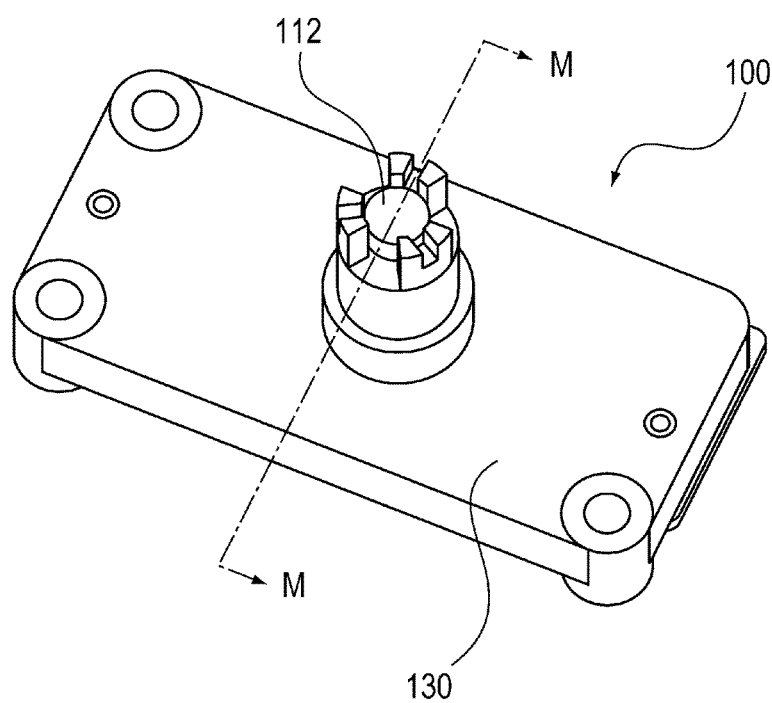
FIG. 3 is a combination of perspective and sectional views of the light source apparatus.
Figure 3:
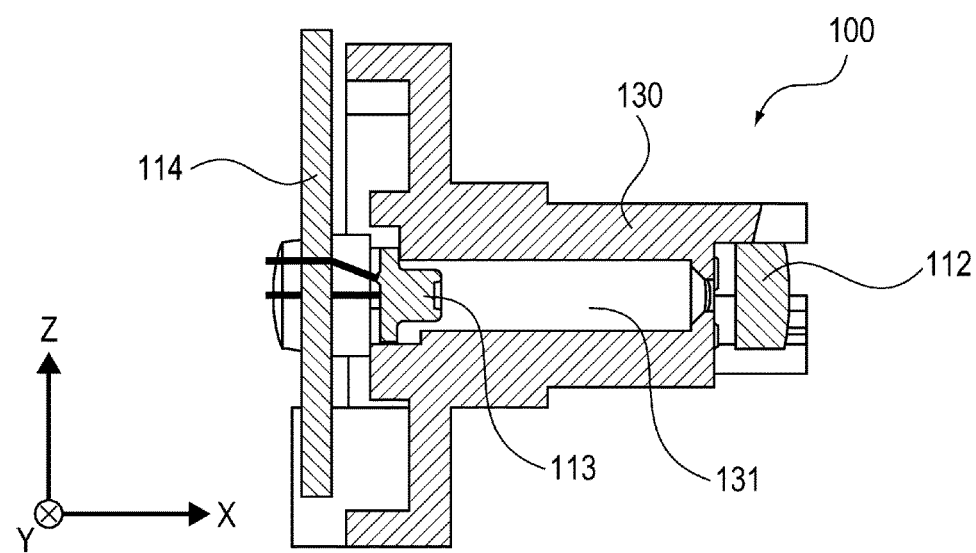

Next, the light source apparatus 100 is described in detail about its structure. Part (a) of FIG. 3 is a perspective view of the light source apparatus 100. Part (b) of FIG. 3 is a sectional view of the light source apparatus 100 at a plane M-M in part (a) of FIG. 3. As is evident from FIG. 3, the light source apparatus 100 has a holder 130, a collimator lens 112, and a laser circuit board 114.

Figure 4:
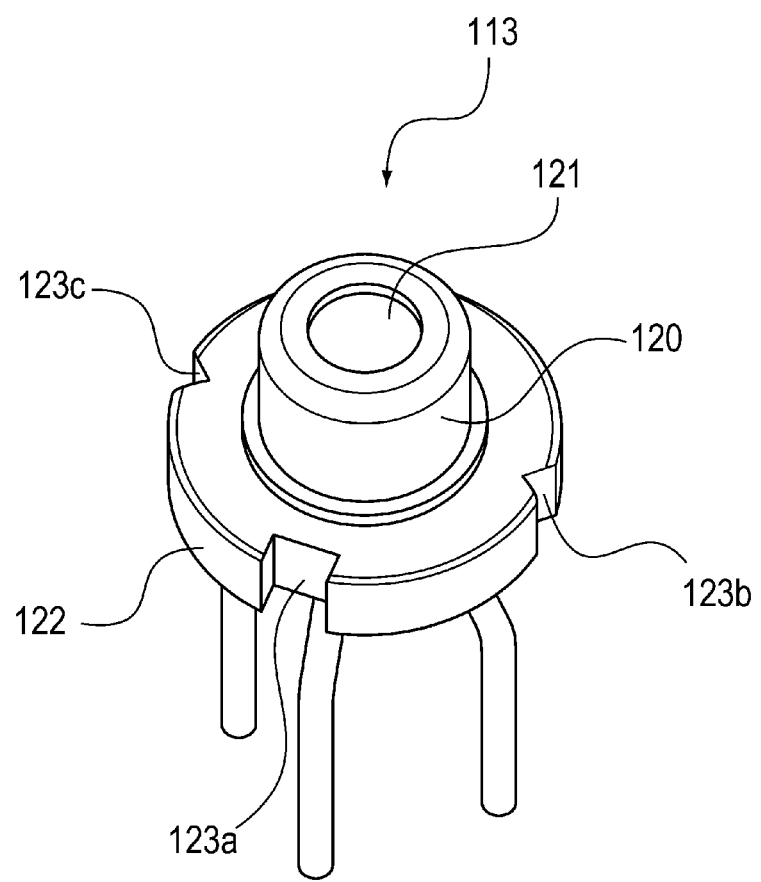
FIG. 4 is a perspective view of a laser.

The semiconductor laser 113 emits a beam of laser light by being driven by an unshown circuit board. Regarding the structure of this semiconductor laser 113, an unshown laser chip, which is a laser light emitting element, is supported by a stem 122 (supporting member), which is the cylindrical flange portion of the metallic holder, by being mounted on the stem 122, as shown in FIG. 4. It is covered with a cap 120, which is provided with a hole 121 though which the beam L of laser light is projected outward of the semiconductor laser 113. By the way, the cap 120 may be structured so that a sealing glass can be inserted into the hole 121 to seal the cap 120. In this embodiment, however, the cap 120 is not provided with the sealing glass, in order to reduce the semiconductor laser 113 in cost. In other words, the laser in this embodiment is a glass-less laser, that is, a laser which does not have the sealing glass. Therefore, the laser chip is exposed to the ambient air.

Further, the peripheral portion of the stem 122, in terms of its radius direction, is provided with recesses 123a, 123b and 123c which are used to manipulate the stem 122 during the manufacturing of the light source apparatus 100. For example, the recesses 123a, 123b, and 123c are used to grasp the semiconductor laser 113, and/or to precisely position the stem 122 in terms of the circumferential direction of the stem 122 when the laser chip is mounted on the step 122. The stem 122 which has the recesses 123a, 123b and 123c as described above has such a shape that is often seen among ordinary semiconductor lasers, and are mass-produced. Therefore, using such a stem as the stem 122 makes it possible to reduce the light source apparatus 100 in cost.

Referring to part (b) of FIG. 3, the holder 130 has a cylindrical portion 131, which holds the semiconductor laser 113 by one of its lengthwise ends. The other end of the cylindrical portion 131 holds the collimator lens 112. By the way, in this embodiment, the semiconductor laser 113 is held to the holder 130 by being pressed into the holder 130. However, the semiconductor laser 113 may be held to the holder 130 by a method other than being pressed into the holder 130.

The collimator lens 112 converts the beam of laser light projected by the semiconductor laser 113, into a parallel beam of laser light, or a beam of laser light which converges or diverges in a preset manner. This collimator lens 112 is held to the holder 130 with the use of the following method. First, the collimator lens 112 is moved in each of the directions parallel to the X, Y and Z axes to adjust the collimator lens 12 in its position relative to the semiconductor laser 113, in order to adjust the beam L of laser light in position, and also, to focus the beam L. Then, the photo-curable adhesive is illuminated with the light for curing the photo-curable adhesive, in order to fix the collimator lens 112 to the holder 130.

<Structure of Portion of Holder, by which Semiconductor Laser is Held by Holder>

Figure 5:
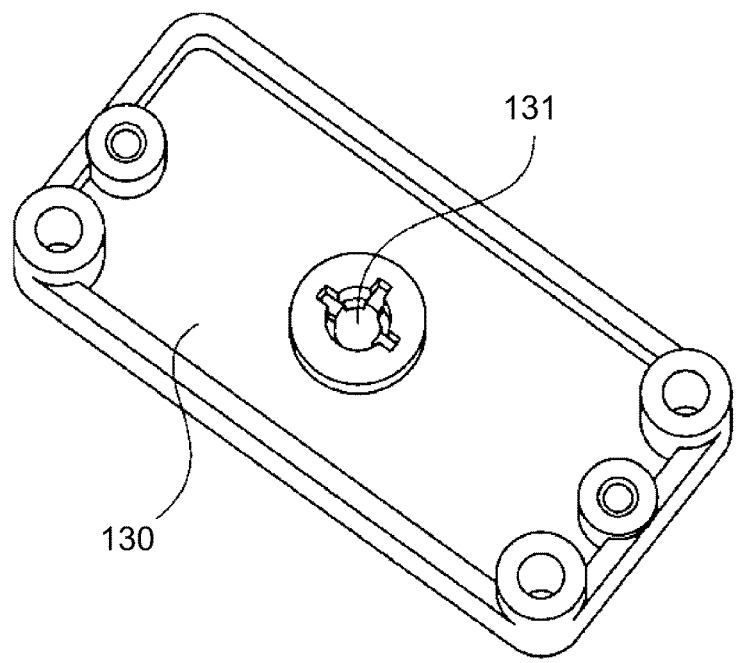
FIG. 5 is a combination of the holder of the light source apparatus in the first embodiment, and an enlarged perspective view of the cylindrical portion of the holder.
Figure 5:
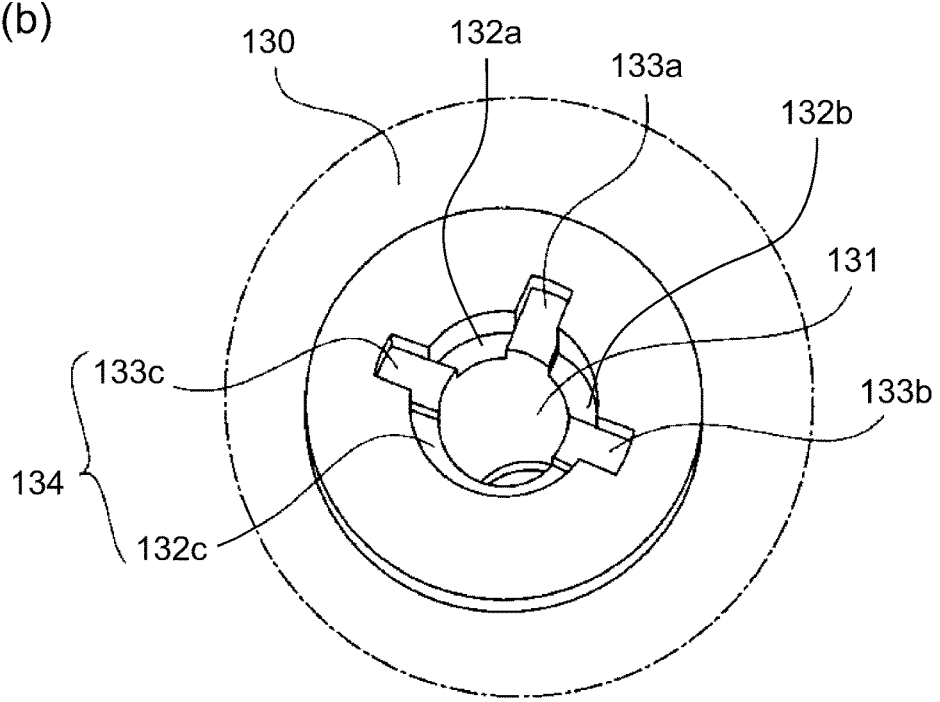

Next, the portion of the holder 130, by which the semiconductor laser 113 is held to the holder 130 is described in detail about its structure. Part (a) of FIG. 5 is a perspective view of the holder 130. Part (b) of FIG. 5 is an enlarged perspective view of the cylindrical portion 131 of the holder 130, and its adjacencies.

In this embodiment, the semiconductor laser 113 is held to the holder 130 by being pressed into the holder 130, as described above. More concretely, the semiconductor laser 113 is held to the holder by pressing the stem 122 of the semiconductor laser 113 into the cylindrical portion 131.

Referring to part (b) of FIG. 5, the inward surface of the cylindrical portion 131 is provided with an opposing area (which hereafter will be referred to as opposing surface 134) which opposes the stem 122 as the stem 122 (semiconductor laser 113) is inserted into the cylindrical portion 131. Further, the opposing surface 134 has areas 133a, 133b, and 133c (which hereafter will be referred to as contact surfaces), which come into contact with the stem 122 as the stem 122 (semiconductor laser 113) is inserted into the cylindrical portion 131 in the direction parallel to the optical axis of the beam L of laser light. In terms of the direction parallel to the optical axis of the beam L of laser light, the contact surfaces 133a, 133b, and 133c are recessed from the laser seating surface T. Moreover, the holder 130 is provided with separation surfaces 132a, 132b, and 132c (separation portions) which are recessed from contact surfaces 133 and remain separated from the stem 122 even after the pressing of the semiconductor laser 113 into the cylindrical portion 131.

Figure 6:
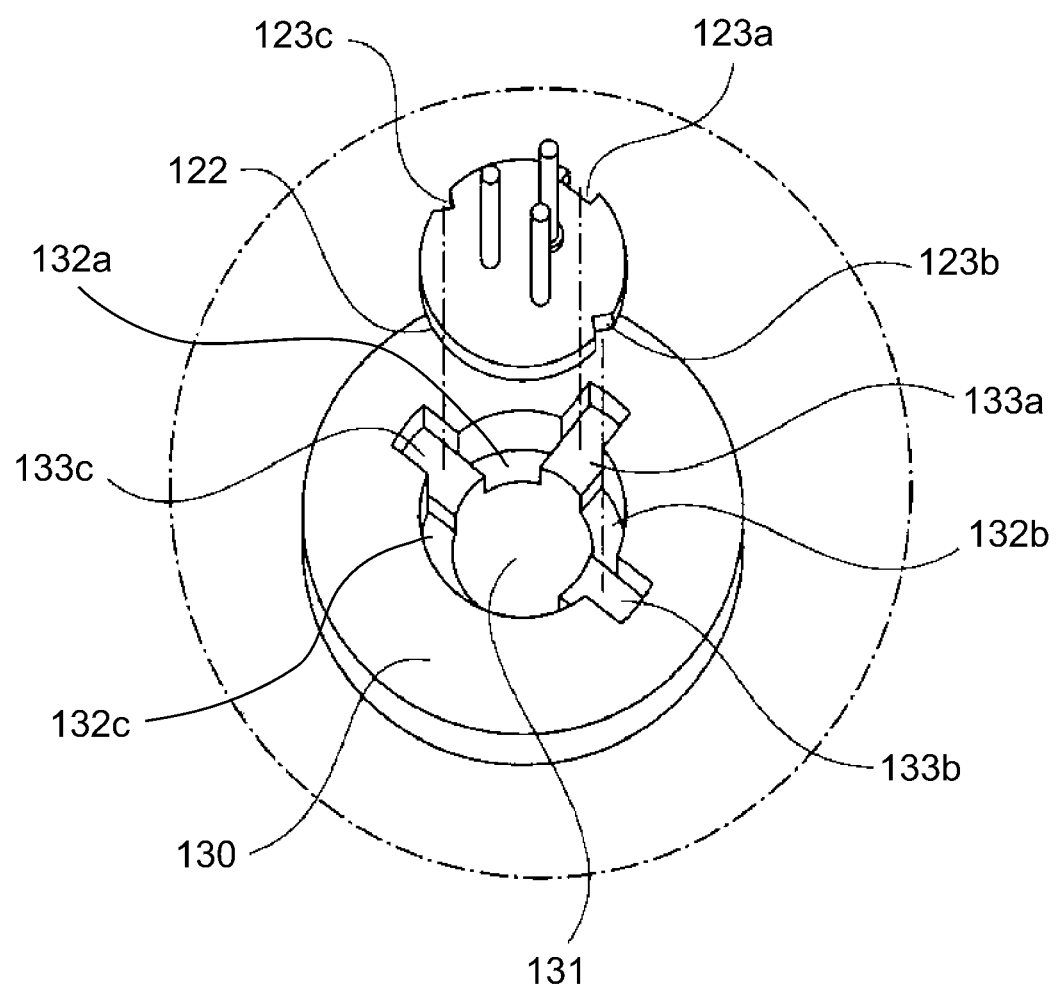
FIG. 6 is a drawing for describing the structure of the portion of the holder of the light source apparatus, by which the laser is held.

The semiconductor laser 113 is attached to the holder 130 in the following manner. Referring to FIG. 6, first, the semiconductor laser 113 is positioned so that the recesses 123a, 123b and 123c of the stem 122 align with the contact surfaces 133a, 133b and 133c, respectively. Then, the semiconductor laser 113 is pressed into the cylindrical portion 131 of the holder 130. That is, the semiconductor laser 113 is positioned so that the contact surfaces 133a, 133b and 133c oppose the recesses 123a, 123b and 123c, respectively.

Figure 7:
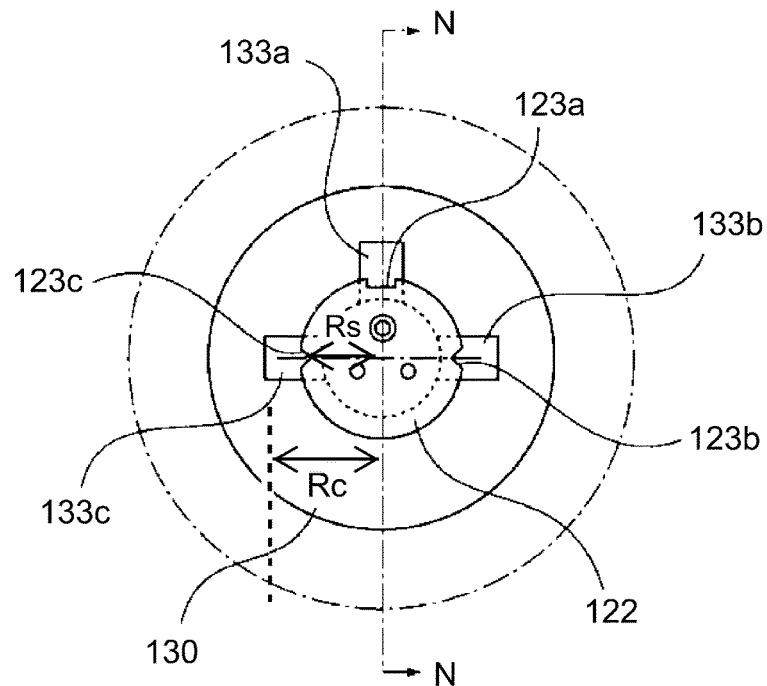
FIG. 7 is a drawing for describing the structure of the portion of the holder of the light source apparatus, by which the laser is held.
Figure 7:
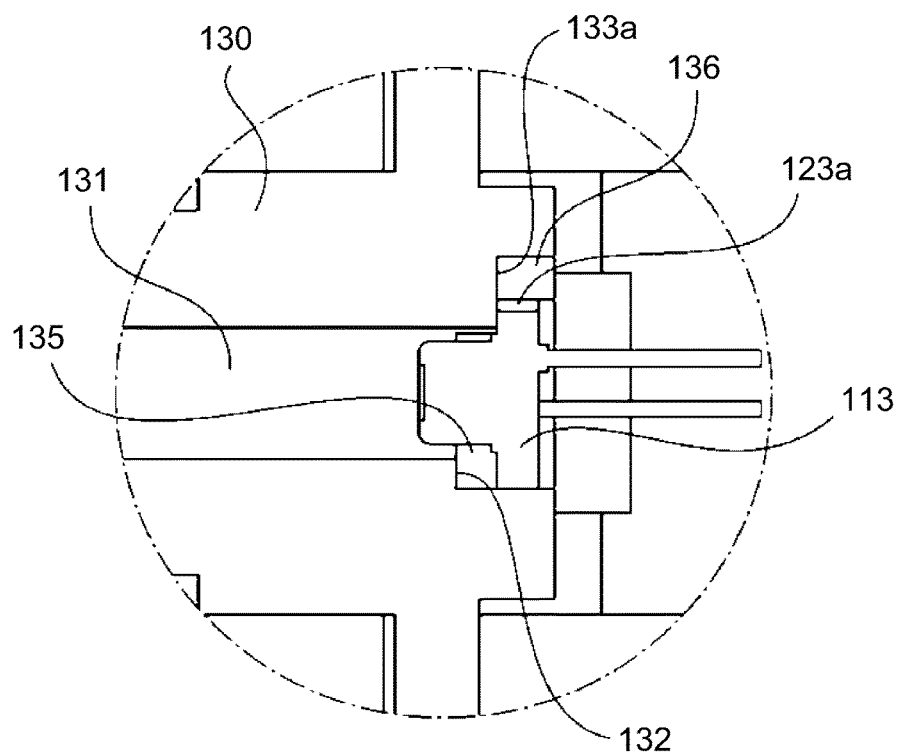
Figure 8:
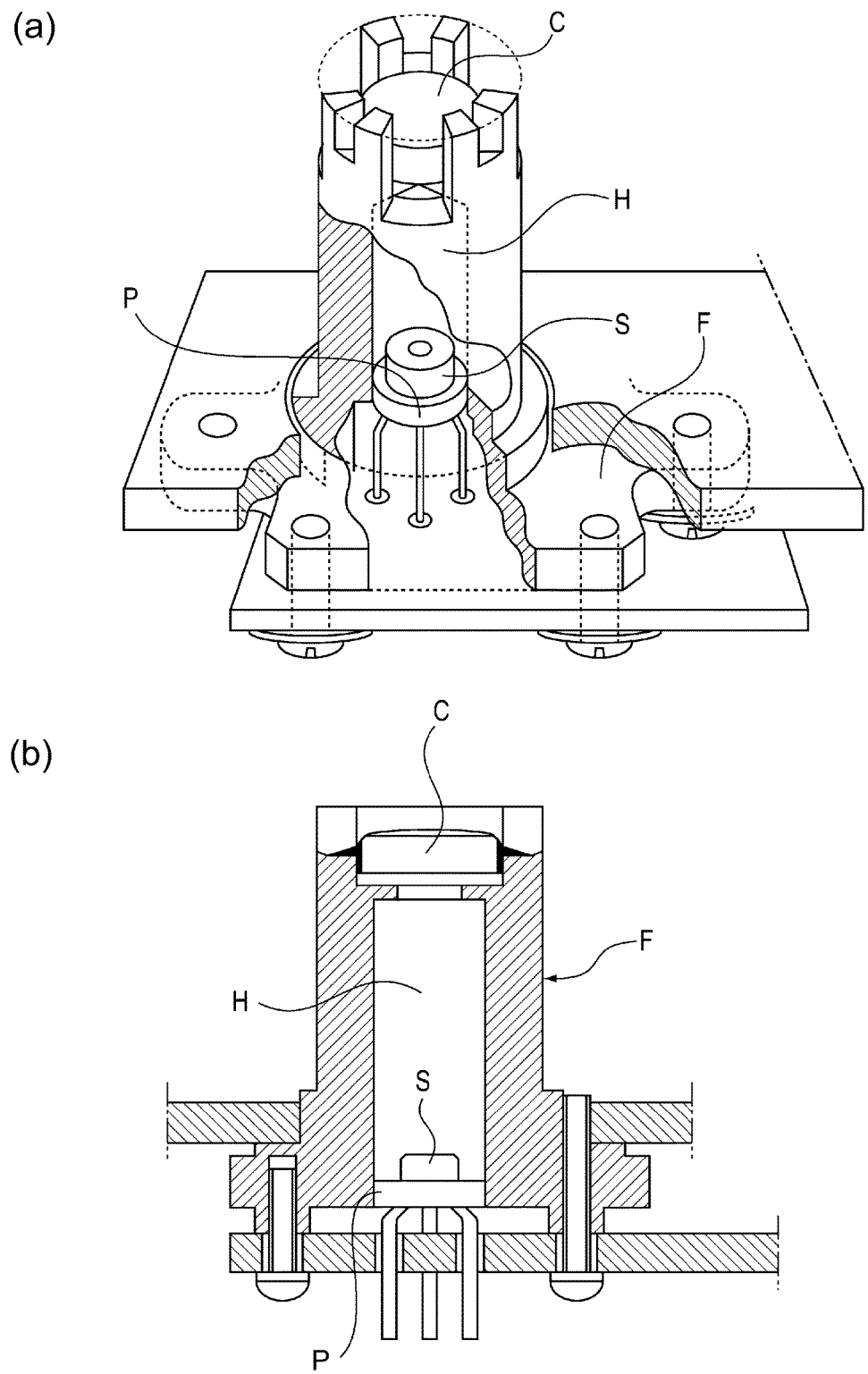
FIG. 8 is a drawing for describing the prior art regarding the structure of a light source apparatus.
Figure 9:
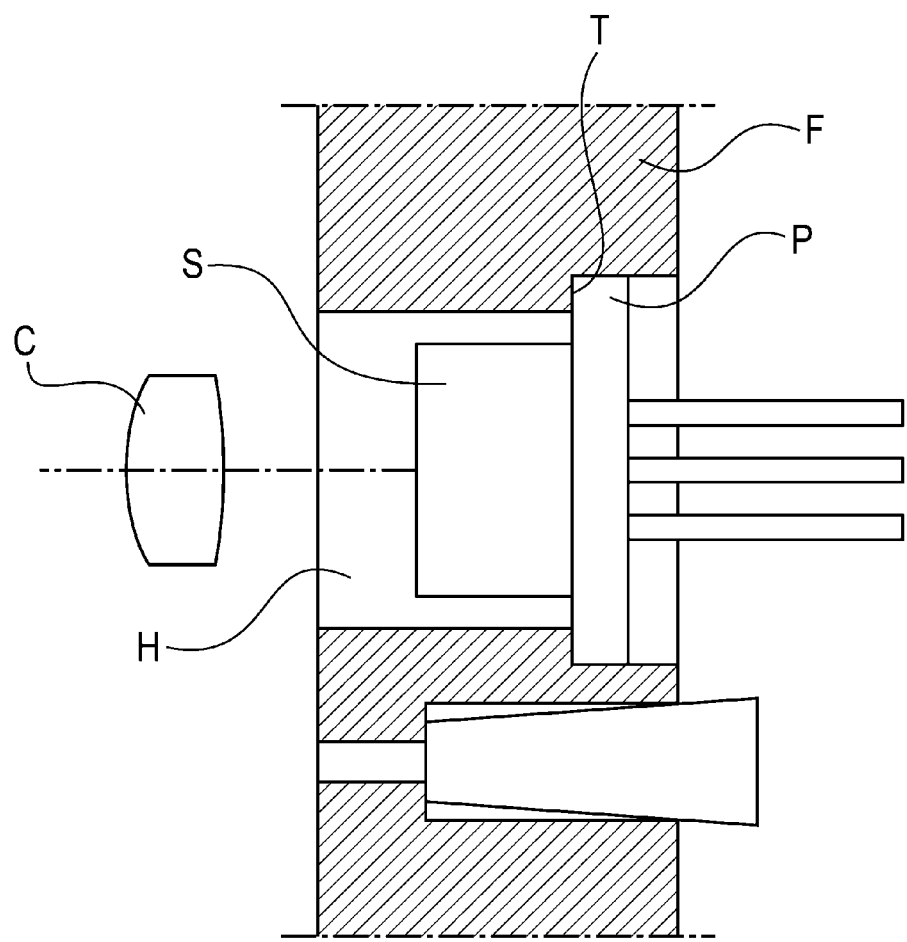
FIG. 9 is also a drawing for describing the prior art regarding the structure of the light source apparatus.
Figure 10:
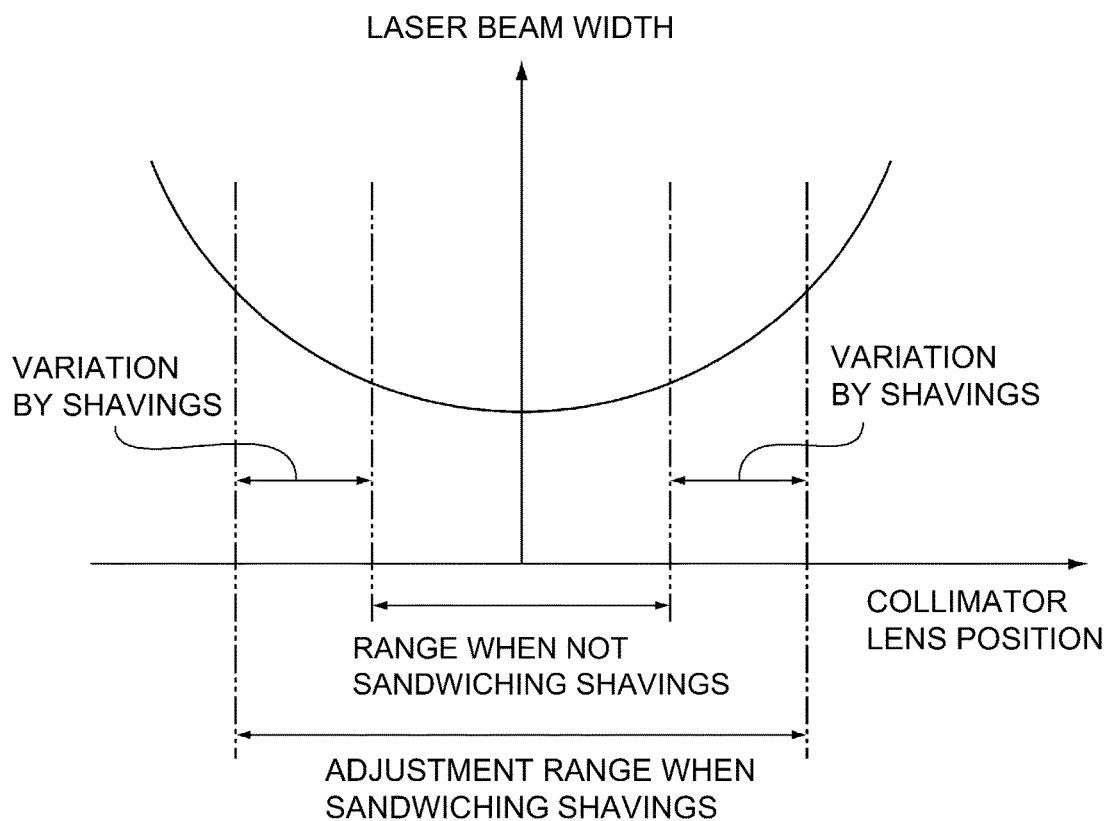
FIG. 10 is also a drawing for describing the prior art regarding the structure of the light source apparatus.

Part (a) of FIG. 7 is a drawing of a combination of the holder 130, and the semiconductor laser 113 held by the holder 130, as the holder is seen from the opposite side of the light source apparatus, from the side from which the beam L of laser light is emitted. By the way, the broken line in part (a) of FIG. 7 indicates the contour of the holder 130 hidden by the semiconductor laser 113. Part (b) of FIG. 7 is a sectional view of a combination of the semiconductor laser 113 and its adjacencies, at a plane N-N in part (a) of FIG. 7, after the pressing of the semiconductor laser 113 into the cylindrical portion 113.

Referring to part (b) of FIG. 7, the stem 122 is held to the holder 130 in such manner that the adjacencies of its recess 123a are in contact with the contact surface 133a. Therefore, there remains no gap between the holder 130 and the stem 122 in terms of the direction parallel to the optical axis of the beam L of laser light. Although part (b) of FIG. 7 shows only the relationship between the recess 123a and contact surface 133a, the relationship between the recess 123b and contact area 133b, and the relationship between the 123c and contact area 133c, are the same as that between the recess 123a and contact surface 133a.

That is, the stem 122 is held to the cylindrical portion 131 by being pressed into the cylindrical portion 131. The peripheral surface of the stem 122 is in contact with the cylindrical internal surface of the cylindrical portion 131. Therefore, there is no gap between the stem 122 and the cylindrical inward surface of the cylindrical portion 131, in terms of the radius direction of the cylindrical portion 131.

With the holder 130 and light source apparatus being structured as described above, there is no gap between the portion of the holder 130, by which the semiconductor laser 113 is held, and the laser S. Thus, the opening which can function as a passage between the outside and inside of the light source apparatus 100 is only the gap between the holder 130 and collimator lens 112. Therefore, it is unlikely for an air flow to occur. Therefore, it is possible to reduce the risk that dust particles invade into the internal space of the holder 130 and adhere to the semiconductor laser 113.

The separation surfaces 132 (132a, 132b and 132c) are recessed from the contact surfaces 133a, 133b and 133c in terms of the direction in which the stem 122 (light source apparatus 100) is inserted into the holder 130. Therefore, dust particles, and the shavings which result from the pressing of the semiconductor laser 113 into the cylindrical portion 131 of the holder 130, settle in the gap 135 between the separation surface 132 and semiconductor laser 113. Therefore, the shavings do not enter the space between the stem 122 and contact surfaces 133a, 133b and 133c. Therefore, the light source apparatus 100 does not need to be increased in the collimator adjustment range.

Further, in this embodiment, the distance Rc from the center of the stem 122 to the outward edge of each of the contact surfaces 133a, 133b and 133c is greater than the radius Rs of the stem 122. Therefore, shavings are not generated in the areas which correspond in position to the contact surfaces 133a, 133b and 133c, making it far less likely for the shavings to enter the space between the contact surfaces 133a, 133b and 133c, and the stem 122 compared to any light source apparatus 100 which is not structured as in this embodiment.

Further, regarding the contact surfaces 133a, 133b and 133c, a gap 136, the size of which corresponds to the difference between the internal diameter of the cylindrical portion 131 and the external diameter of the stem 122, is created between the cylindrical inward surface of the cylindrical portion 131 and the peripheral surface of the stem 122. Thus, the shavings are retained in this gap 136. Therefore, it is possible to more effectively present the shavings from entering the space between each of the contact surfaces 133a, 133b and 133c, and the stem 122.

By the way, in this embodiment, the light source apparatus 100 is structured so that all the recesses 123 of the stem 122 are covered. However, this embodiment is not intended to limit the present invention in scope. That is, effects similar to those obtained by this embodiment can be obtained by covering at least one of the recesses, for example, the largest one, the recess which is easiest for the shavings to invade, or the like.

According to the present invention, the cylindrical portion of the holder has contact portions which correspond in position to the recesses of the stem portion of the semiconductor laser. Thus, after the pressing of the semiconductor laser into the cylindrical portion of the holder, there is no gap between the cylindrical portion of the holder and the stem portion of the semiconductor laser. Further, the shavings which are possibly generated when the semiconductor is pressed into the cylindrical portion so that it is held to the holder by the supporting portion (stem portion) can be retained in the gaps provided by the aforementioned separation portions. Therefore, it is possible to minimize the possibility of the occurrence of the aforementioned air flow. Therefore, it is possible to minimize the possibility that the shavings will reduce the accuracy with which the semiconductor laser is positioned relative to the holder when it is pressed into the holder. Therefore, it is possible to prevent the occurrence of the image defects attributable to the adhesion of foreign substances to the semiconductor laser, without increasing the light source apparatus in terms of the range through which the collimator lens is movable for positional adjustment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-187133 filed on Sep. 24, 2015, which is hereby incorporated by reference herein in its entirety.

What is claimed is:

1. A light source device comprising:
a semiconductor laser configured to emit a laser beam, said semiconductor laser including a stem provided with a cut-away portion; and
a holder member including a cylindrical portion configured to hold said semiconductor laser,
wherein an inner surface of said cylindrical portion has a surface opposing said stem,
wherein said opposing surface includes a contact portion and a spaced portion, the contact portion being disposed at a position corresponding to said cut-away portion and contacting said stem and the spaced portion being spaced from said stem, and
wherein a length measured from a central portion of said stem to an end portion of said contact portion in a radial direction from the central portion of said stem is longer than a length measured from the central portion of said stem to an end portion of said spaced portion.

2. A device according to claim 1, wherein said spaced portion is recessed as compared with said contact portion in a direction in which said semiconductor laser is insertable into said cylindrical portion.

3. A device according to claim 1, wherein a light source inside said semiconductor laser is uncovered.

4. A scanning optical apparatus comprising:
a light source device according to claim 1;
a scanning means configured to scan a surface to be scanned with the laser beam emitted from said light source device.

5. An image forming apparatus comprising:
a photosensitive member;
a scanning optical device according to claim 4, said scanning of the device being configured to scan said photosensitive member with a laser beam modulated in accordance with image information to form an electrostatic latent image of said photosensitive member;
a developing portion configured to develop the electrostatic latent image formed on said photosensitive member with toner into a toner image; and
a transfer portion configured to transfer the toner image formed on said photosensitive member onto a recording material.

6. A light source device comprising:
a semiconductor laser configured to emit a laser beam, said semiconductor laser including a stem provided with a cut-away portion; and
a holder member configured to hold said semiconductor laser,
wherein said holder member is provided with a recess to which said semiconductor laser is mounted, and said recess includes an opposing surface facing in an emitting direction of said semiconductor laser,
wherein said opposing surface includes a contact portion and a spaced portion, the contact portion being disposed at a position corresponding to said cut-away portion and contacting said stem and the spaced portion being spaced from said stem, and
wherein a length measured from a center of said recess to an end portion of said contact portion in a radial direction from the center of said recess is longer than a length measured from the center of said recess to an end portion of said spaced portion.

7. A device according to claim 6, wherein said spaced portion is recessed as compared with said contact portion in a direction in which said semiconductor laser is insertable into said cylindrical portion.

8. A device according to claim 6, wherein a light source inside said semiconductor laser is uncovered.

9. A scanning optical apparatus comprising:
a light source device according to claim 6;
a scanning means configured to scan a surface to be scanned with the laser beam emitted from said light source device.

10. An image forming apparatus comprising:
a photosensitive member;
a scanning optical device according to claim 9, said scanning of the device being configured to scan said photosensitive member with a laser beam modulated in accordance with image information to form an electrostatic latent image of said photosensitive member;
a developing portion configured to develop the electrostatic latent image formed on said photosensitive member with toner into a toner image; and
a transfer portion configured to transfer the toner image formed on said photosensitive member onto a recording material.

* * * * *